US012666557B2

(12) United States Patent
Yang et al.

(10) Patent No.: US 12,666,557 B2
(45) Date of Patent: Jun. 23, 2026

(54) SERVER AND SERVER SYSTEM

(71) Applicant: Fulian Precision Electronics (Tianjin) Co., LTD., Tianjin (CN)

(72) Inventors: Bin-Bin Yang, Tianjin (CN); Meng-Ya Cui, Tianjin (CN); Ge Liu, TianJin (CN); Jin-Wei Zhang, Tianjin (CN)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 230 days.

(21) Appl. No.: 18/229,202

(22) Filed: Aug. 2, 2023

(65) Prior Publication Data

US 2025/0008679 A1    Jan. 2, 2025

(30) Foreign Application Priority Data

Jun. 30, 2023    (CN) ........................ 202321709850.X

(51) Int. Cl.
H05K 7/14    (2006.01)

(52) U.S. Cl.
CPC ......... H05K 7/1487 (2013.01); H05K 7/1485 (2013.01); H05K 7/1488 (2013.01); H05K 7/1489 (2013.01)

(58) Field of Classification Search
CPC .. H05K 7/1402; H05K 7/1411; H05K 7/1421; H05K 7/1422; H05K 7/1424; H05K 7/1425; H05K 7/1427; H05K 7/1461; H05K 7/1485; H05K 7/1487; H05K 7/1488; H05K 7/1489; H05K 7/18; G06F 1/18; G06F 1/181; G06F 1/182; G06F 1/183; G06F 1/184; G06F 1/185; G06F 1/186; G06F 1/187; G11B 33/124; G11B 33/125; G11B 33/127; G11B 33/128

See application file for complete search history.

(56) References Cited

U.S. PATENT DOCUMENTS

| | | | | | |
|---|---|---|---|---|---|
| 4,988,577 | A | * | 1/1991 | Jamieson | H05K 1/0271 |
| | | | | | 428/596 |
| 5,198,279 | A | * | 3/1993 | Beinhaur | H05K 1/0271 |
| | | | | | 174/250 |
| 5,481,431 | A | * | 1/1996 | Siahpolo | G11B 33/08 |
| 5,641,296 | A | * | 6/1997 | Larabell | H01R 13/62933 |
| 5,761,459 | A | * | 6/1998 | Schnoor | H05K 7/1427 |
| | | | | | 710/305 |
| 5,984,732 | A | * | 11/1999 | Mehring | H01R 13/514 |
| | | | | | 439/701 |
| 6,301,105 | B2 | * | 10/2001 | Glorioso | G11B 33/08 |
| | | | | | 361/801 |
| 6,567,275 | B1 | * | 5/2003 | Hou | H05K 5/30 |
| | | | | | 361/740 |
| 6,580,606 | B1 | * | 6/2003 | Leman | G06F 1/187 |

(Continued)

*Primary Examiner* — Gage Crum
(74) *Attorney, Agent, or Firm* — ScienBiziP, P.C.

(57) ABSTRACT

A server includes a server module and an expansion module, the server module includes a first tray provided with a first connecting mechanism, a first circuit board mounted on the first tray, and a top cover covered on the first tray for enclosing the first circuit board between the first tray and the top cover; the expansion module includes a second tray provided with a second connecting mechanism matching with the first connecting mechanism and a second circuit board mounted on the second tray, the second circuit board is electrically connected to the first circuit board. A server system is also provided.

9 Claims, 12 Drawing Sheets

(56)         References Cited

U.S. PATENT DOCUMENTS

| | | | | |
|---|---|---|---|---|
| 6,819,567 | B2 * | 11/2004 | Baker | G11B 33/126 |
| 7,242,589 | B1 * | 7/2007 | Cheng | H05K 5/30 |
| | | | | 439/928 |
| 8,472,198 | B2 * | 6/2013 | Peng | G06F 1/181 |
| | | | | 361/728 |
| 8,625,285 | B2 * | 1/2014 | Peng | H05K 7/1491 |
| | | | | 361/724 |
| 8,867,214 | B2 * | 10/2014 | Ross | G06F 1/187 |
| | | | | 361/725 |
| 8,929,024 | B1 * | 1/2015 | Sorenson, III | G06F 3/0617 |
| | | | | 360/98.05 |
| 9,466,964 | B1 * | 10/2016 | Watson | H05K 7/1491 |
| 9,532,480 | B2 * | 12/2016 | Shen | G06F 1/184 |
| 9,538,684 | B2 * | 1/2017 | Chen | H05K 7/1489 |
| 9,706,678 | B1 * | 7/2017 | Chen | H05K 7/1491 |
| 9,936,599 | B1 * | 4/2018 | Shih | H05K 5/023 |
| 9,949,407 | B1 * | 4/2018 | Beall | H05K 7/20727 |
| 10,123,446 | B1 * | 11/2018 | Hou | H05K 5/30 |
| 10,212,842 | B1 * | 2/2019 | Schulze | G11B 33/128 |
| 10,281,960 | B2 * | 5/2019 | Liu | G06F 1/184 |
| 10,470,334 | B1 * | 11/2019 | Mao | H05K 7/1489 |
| 10,642,319 | B2 * | 5/2020 | Chen | G06F 1/187 |
| 10,687,439 | B2 * | 6/2020 | Hayashi | H05K 7/1492 |
| 10,863,644 | B1 * | 12/2020 | Tseng | H05K 7/1487 |
| 11,310,932 | B2 * | 4/2022 | Chang | H05K 7/16 |
| 11,538,132 | B2 * | 12/2022 | Ni | G06F 15/78 |

| | | | | |
|---|---|---|---|---|
| 2003/0007321 | A1 * | 1/2003 | Dayley | H05K 7/1435 |
| | | | | 361/679.6 |
| 2003/0099089 | A1 * | 5/2003 | Chen | G06F 1/187 |
| | | | | 361/679.33 |
| 2006/0171110 | A1 * | 8/2006 | Li | G11B 33/128 |
| 2007/0281531 | A1 * | 12/2007 | Cheng | G06F 1/181 |
| | | | | 439/304 |
| 2008/0061661 | A1 * | 3/2008 | Lin | G06F 1/18 |
| | | | | 361/600 |
| 2010/0033924 | A1 * | 2/2010 | Olesiewicz | G06F 1/185 |
| | | | | 361/679.57 |
| 2012/0262876 | A1 * | 10/2012 | Hensley | H05K 5/30 |
| | | | | 312/107 |
| 2014/0285977 | A1 * | 9/2014 | Li | G11B 33/128 |
| | | | | 361/747 |
| 2016/0132078 | A1 * | 5/2016 | Shen | G06F 11/2005 |
| | | | | 361/679.32 |
| 2016/0170453 | A1 * | 6/2016 | Yamazaki | G06F 1/183 |
| | | | | 361/679.4 |
| 2017/0135242 | A1 * | 5/2017 | Kurosaki | H05K 7/1487 |
| 2017/0227997 | A1 * | 8/2017 | Godfrey | H05K 5/30 |
| 2019/0215981 | A1 * | 7/2019 | Chen | G11B 33/125 |
| 2021/0048866 | A1 * | 2/2021 | Exoo | G06F 1/181 |
| 2021/0385962 | A1 * | 12/2021 | Chang | H05K 7/1409 |
| 2023/0189457 | A1 * | 6/2023 | Tsorng | H05K 7/20727 |
| | | | | 361/679.59 |
| 2023/0225072 | A1 * | 7/2023 | Zhong | H05K 7/1401 |
| | | | | 211/26.2 |
| 2024/0134424 | A1 * | 4/2024 | Carver | G06F 1/186 |

* cited by examiner

100

200

SERVER AND SERVER SYSTEM

FIELD

The subject matter relates to server technologies, and more particularly to a server and a server system.

BACKGROUND

With the continuous development of computer and server technologies, in order to enhance the flexibility and reduce the cost of servers, servers are typically designed with specifications such as 1U, 2U, 3U, etc. Users can purchase servers of appropriate specifications according to their own needs. However, in order to meet the diverse needs of users, manufacturers need to provide servers with different specifications and design different chassis for the servers of different specifications, resulting in higher production costs and limited flexibility.

Therefore, there is room for improvement within the art.

BRIEF DESCRIPTION OF THE DRAWINGS

Implementations of the present technology will now be described, by way of example only, with reference to the attached figures.

DETAILED DESCRIPTION

Figure 1:
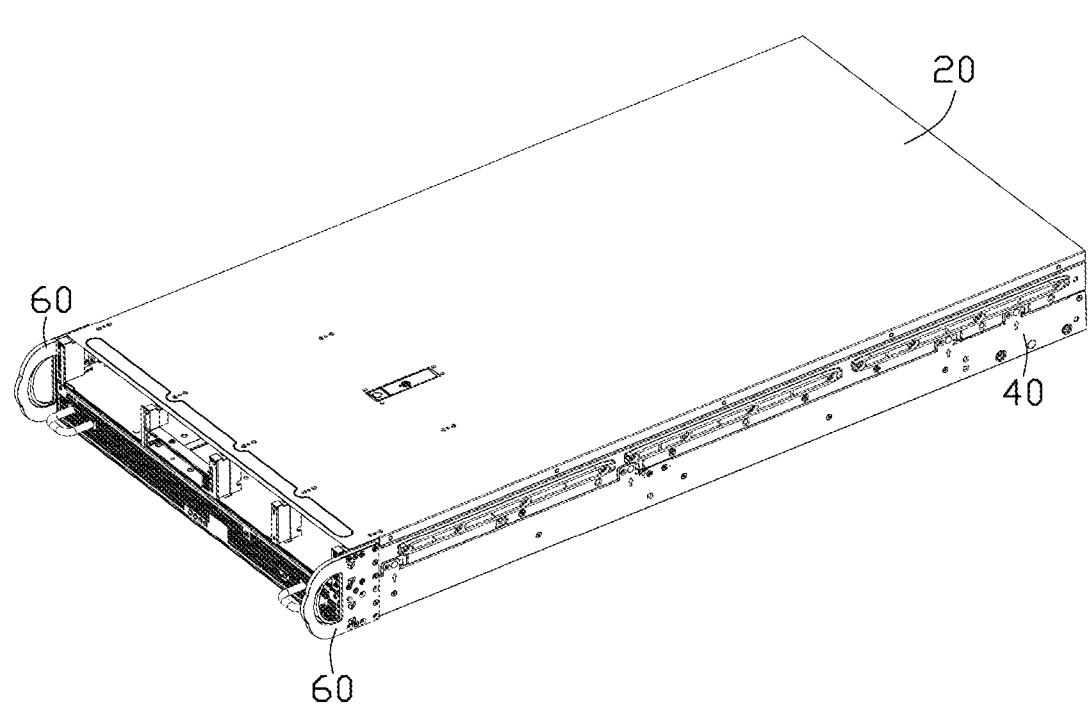
FIG. 1 is a perspective view of a server according to an embodiment of the present application.

It will be appreciated that for simplicity and clarity of illustration, where appropriate, reference numerals have been repeated among the different figures to indicate corresponding or analogous components. The description is not to be considered as limiting the scope of the embodiments described herein. The drawings are not necessarily to scale and the proportions of certain parts may be exaggerated to better illustrate details and features of the present application.

It should be understood that, the terms "first" and "second" are used to distinguish between elements and are not used to denote a particular order or imply a number of technical features, therefore, unless specifically defined, features described as "first" and "second" may expressly or implicitly include one or more of the stated features. In the description of the present application, "plurality" means "two or more", unless otherwise expressly and specifically defined.

In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described.

The term "comprising," when utilized, means "including, but not necessarily limited to"; it specifically indicates open-ended inclusion or membership in the so-described combination, group, series, and the like.

A description of the hereinafter described embodiments of the present application is presented herein with reference to the figures by way of exemplification and not as limitation.

Referring to FIG. 1, a server 100 is provided. The server 100 includes a server module 20 and an expansion module 40. Both the server module 20 and the expansion module 40 have a size specification of 1U. When the server module 20 and the expansion module 40 are combined, the server 100 obtains a size specification of 2U.

Figure 2:
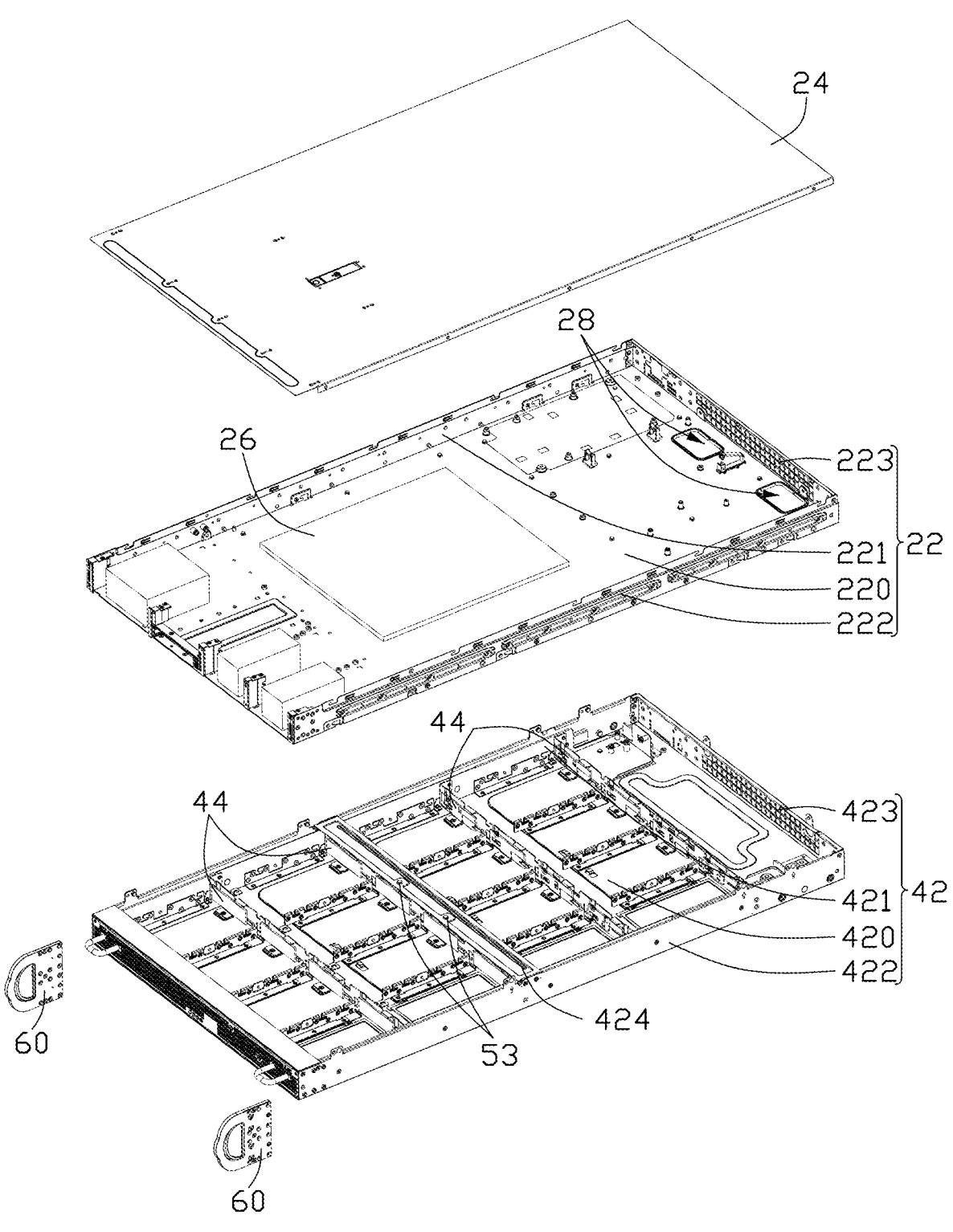
FIG. 2 is an exploded view of the server in FIG. 1.
Figure 3:
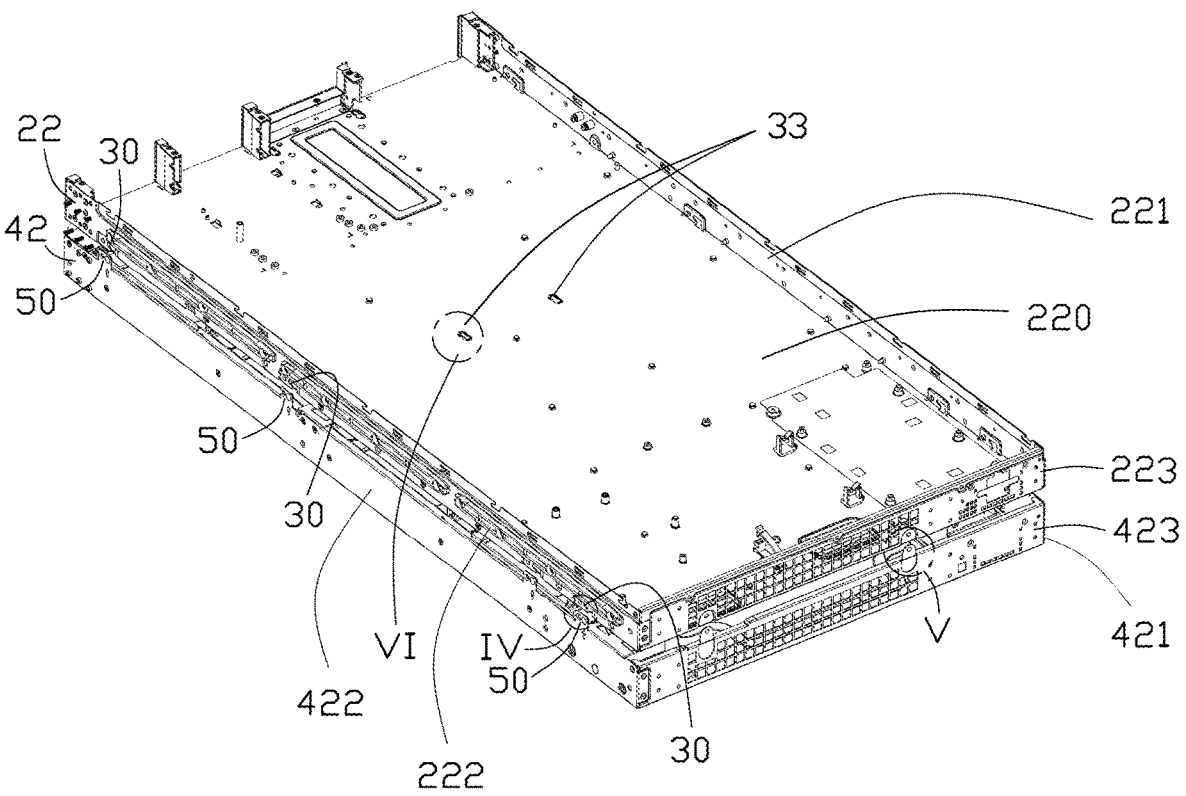
FIG. 3 is a perspective view of the server in FIG. 1, where a server module of the server is not attached to an expansion module of the server.
Figure 4:
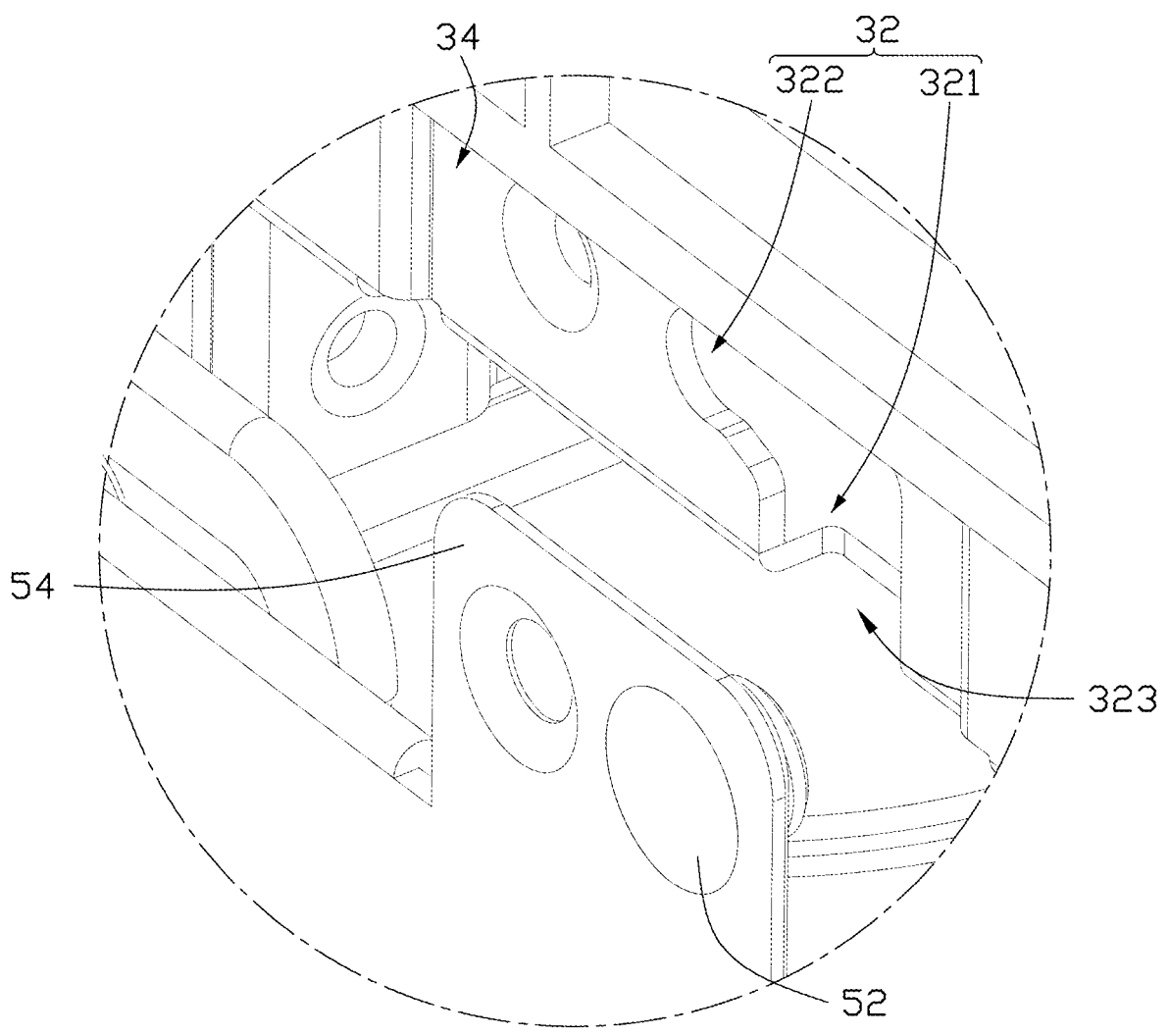
FIG. 4 is an enlarged view of portion IV in FIG. 3.
Figure 5:
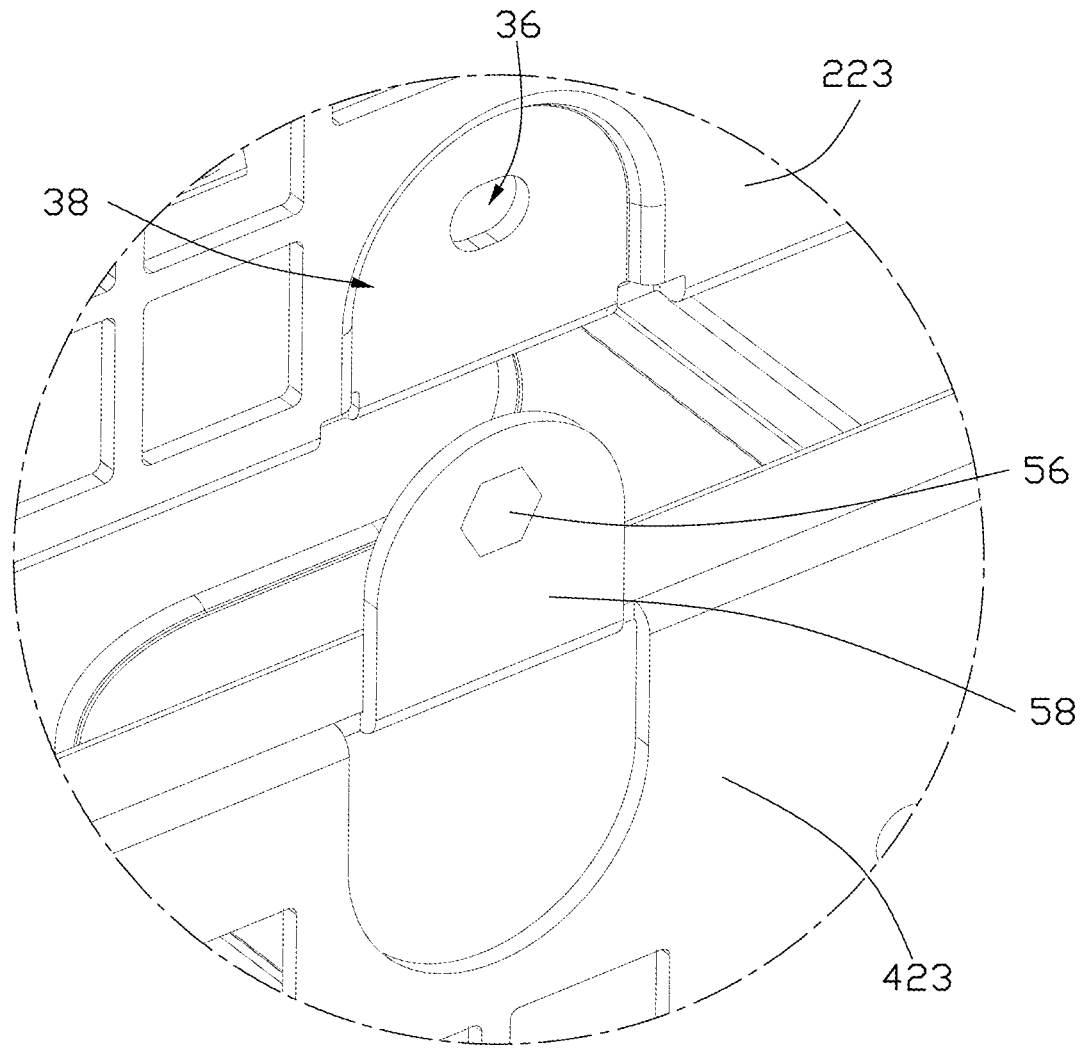
FIG. 5 is an enlarged view of portion V in FIG. 3.
Figure 6:
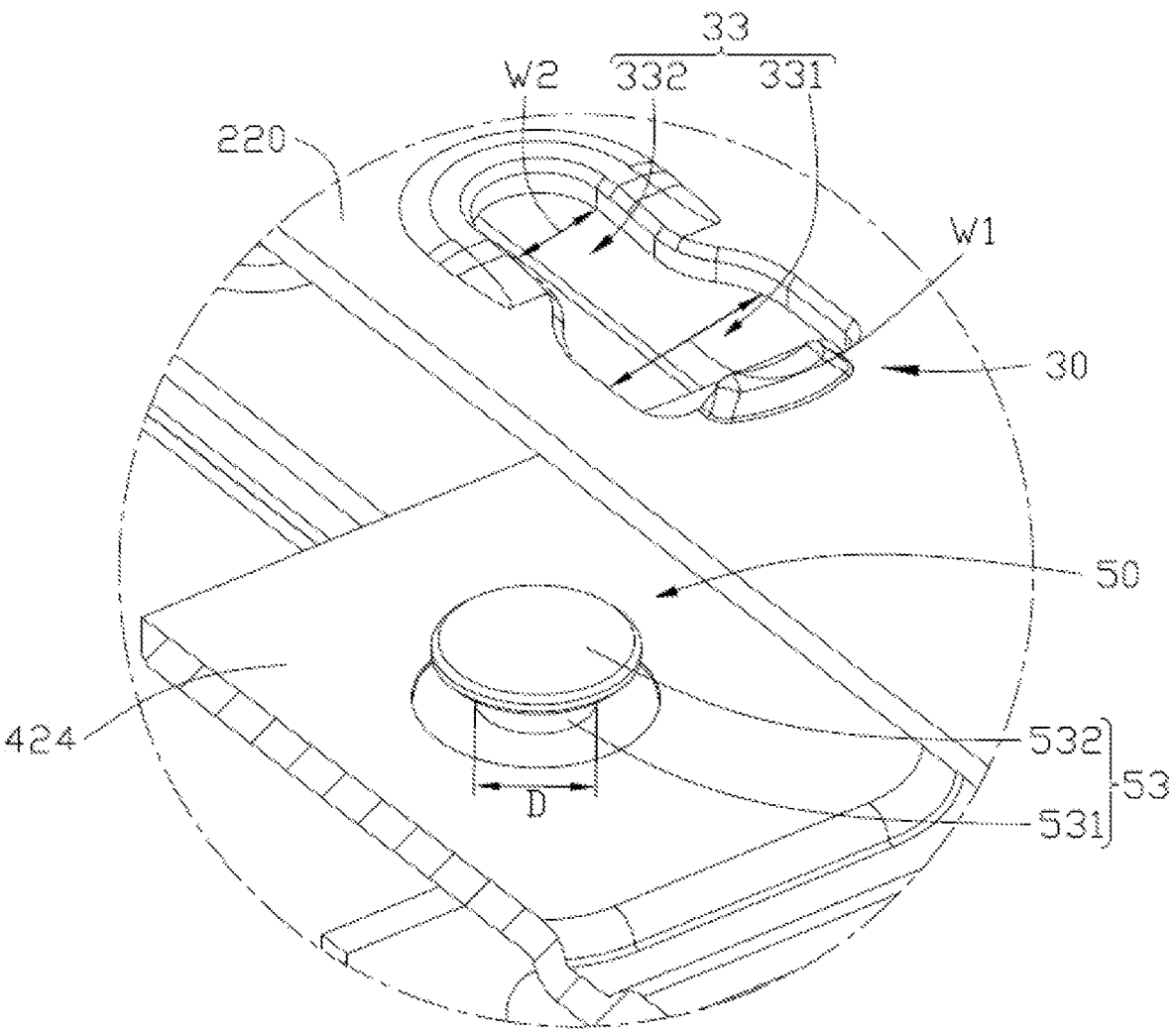
FIG. 6 is an enlarged view of portion VI in FIG. 3.
Figure 7:
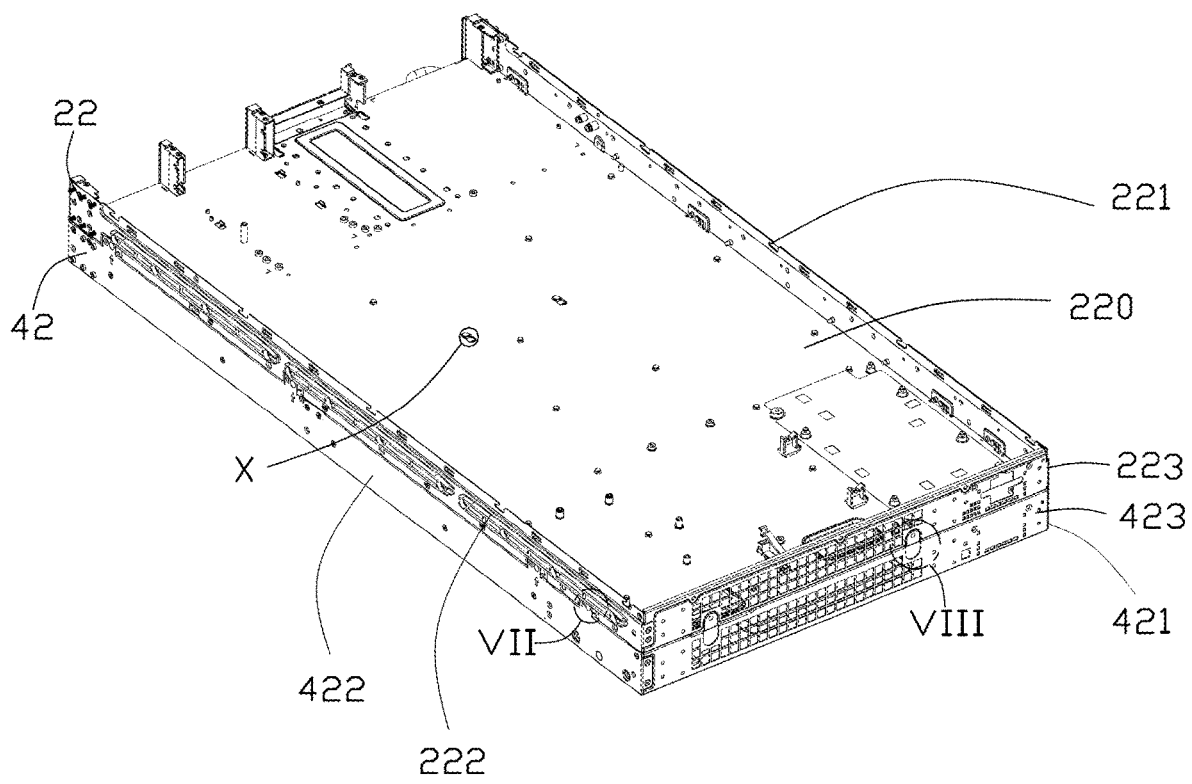
FIG. 7 is a perspective view of the server in FIG. 1, where the server module is attached to the expansion module.
Figure 8:
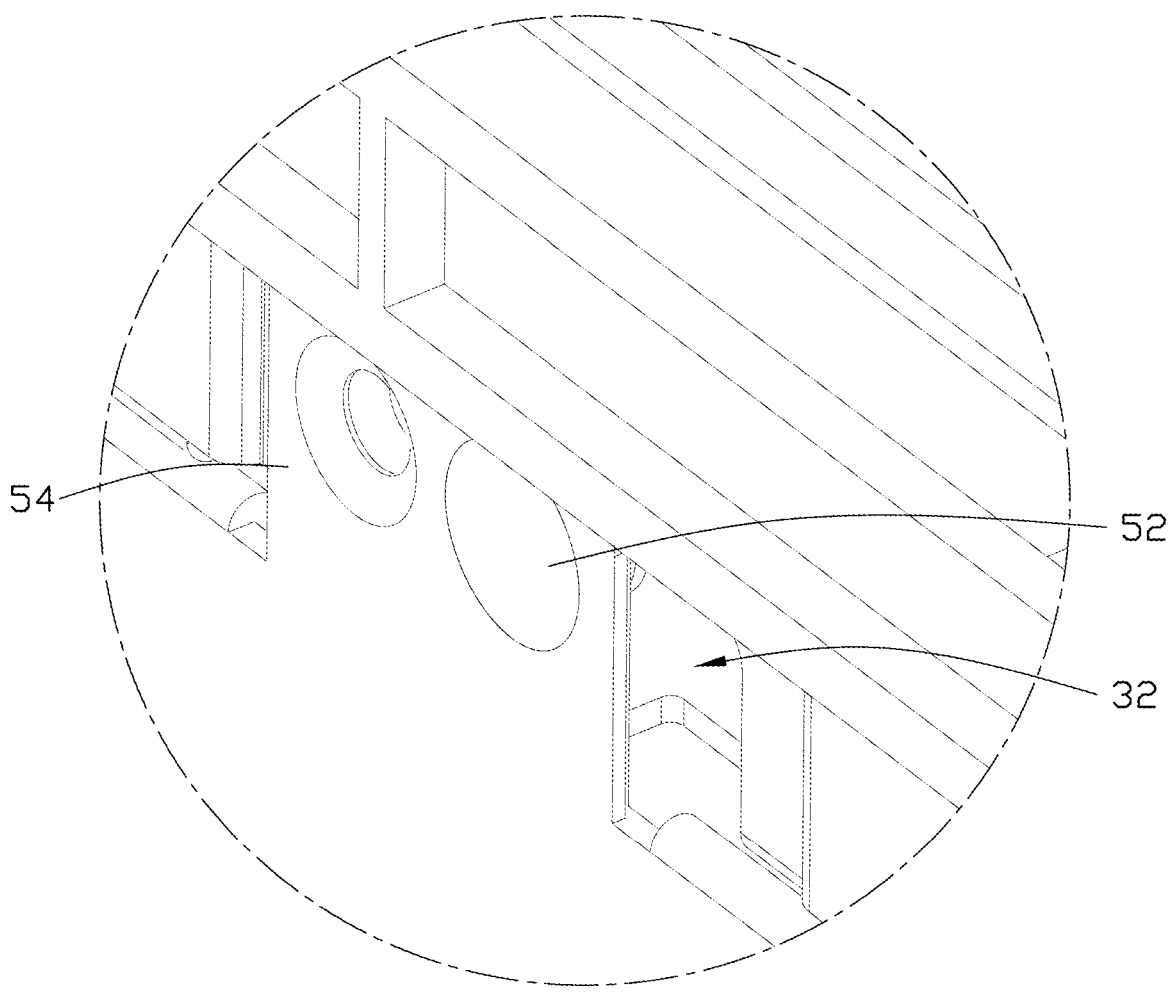
FIG. 8 is an enlarged view of portion VII in FIG. 7.
Figure 9:
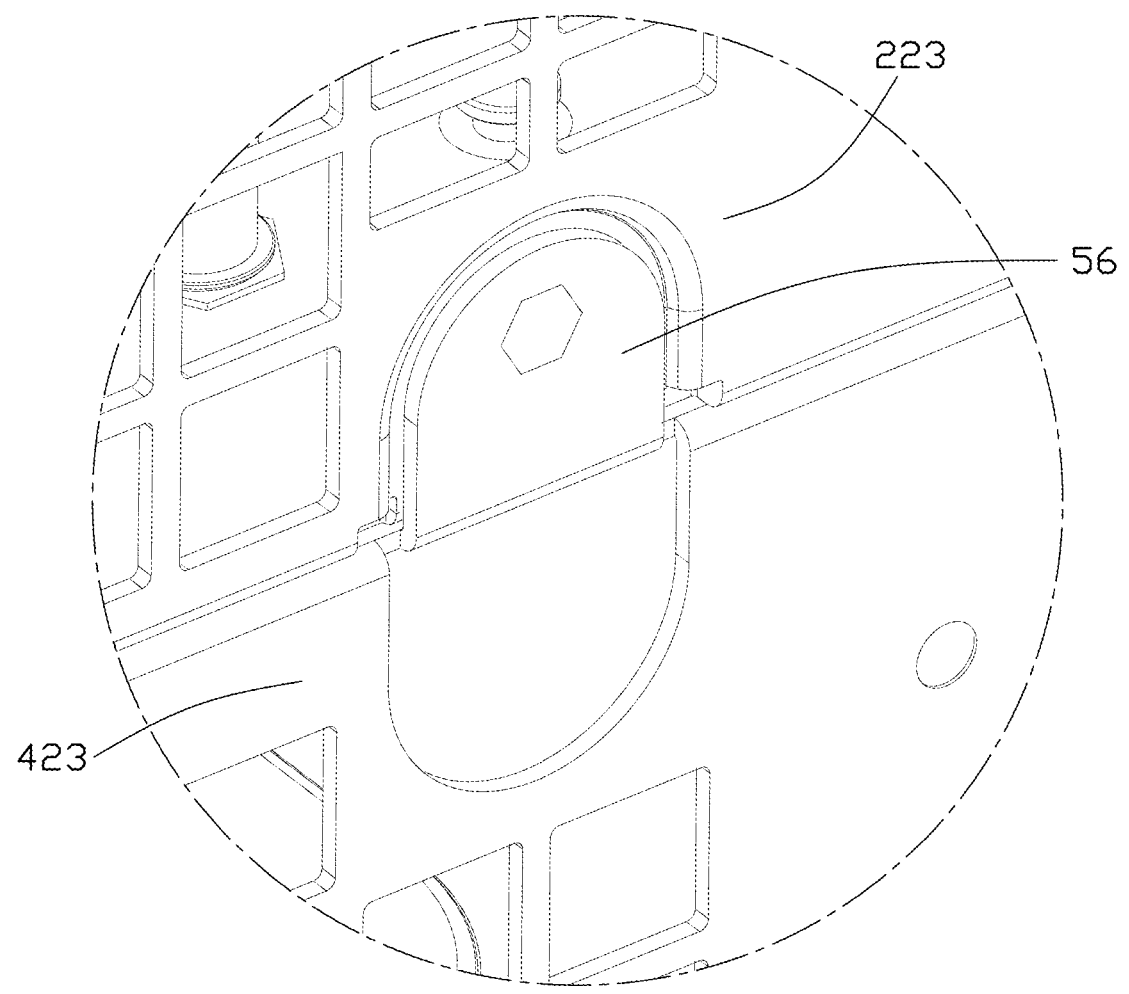
FIG. 9 is an enlarged view of portion VIII in FIG. 7.
Figure 10:
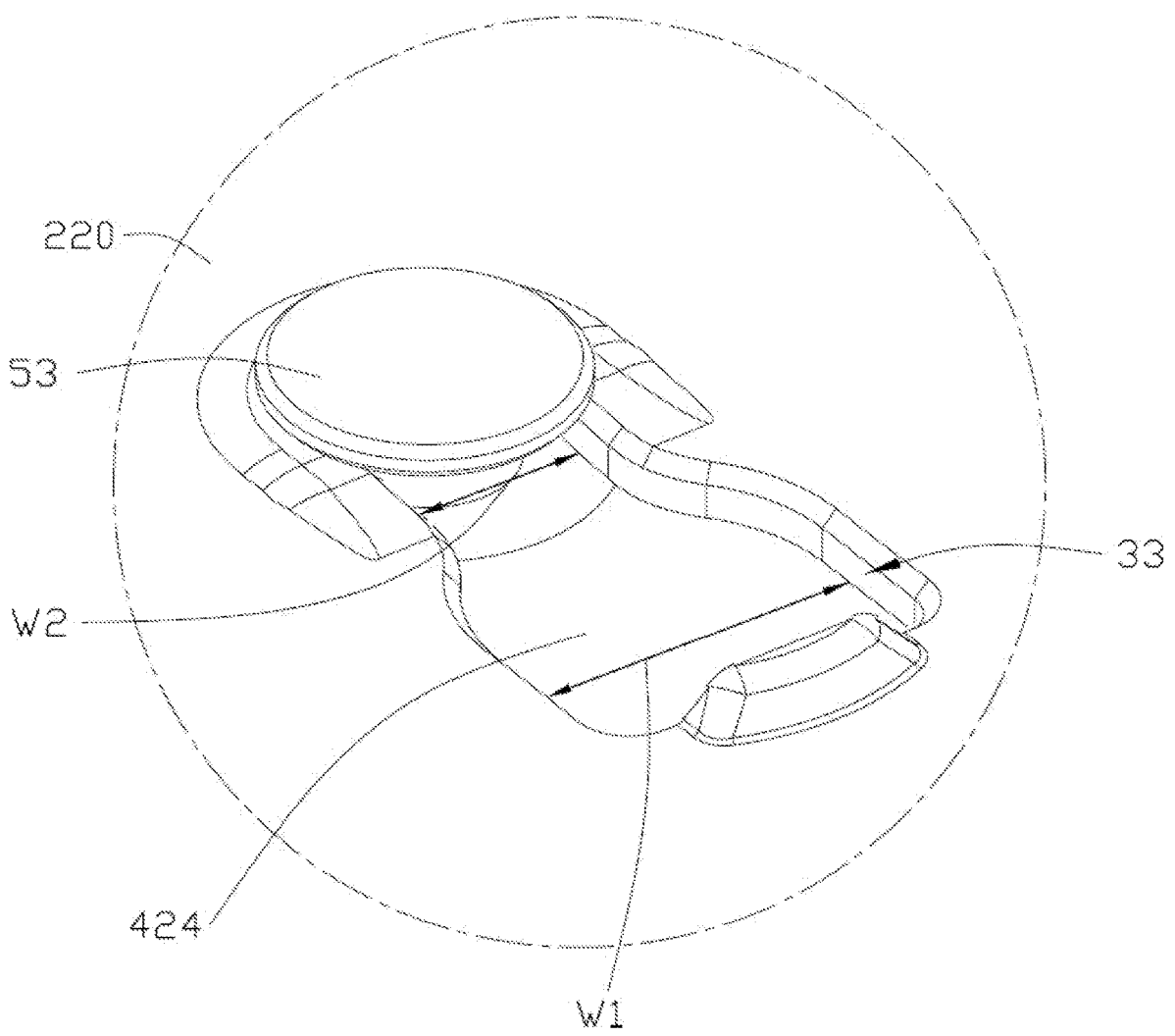
FIG. 10 is an enlarged view of portion X in FIG. 7.

Referring to FIG. 1, FIG. 2, and FIG. 3, the server module 20 includes a first tray 22, a top cover 24, and a first circuit board 26. The first circuit board 26 is mounted on the first tray 22, and the top cover 24 is placed on the first tray 22, enclosing the first circuit board 26 between the first tray 22 and the top cover 24. The expansion module 40 includes a second tray 42 and a second circuit board 44 installed in the second tray 42. For ease of illustration, the first circuit board 26 is omitted in FIG. 3. The first tray 22 is equipped with a first connecting mechanism 30, and the second tray 42 is equipped with a second connecting mechanism 50 that matches the first connecting mechanism 30. The first connecting mechanism 30 and the second connecting mechanism 50 cooperate to connect the first tray 22 and the second tray 42 together, and the second circuit board 44 is electrically connected to the first circuit board 26 via a cable (not shown).

Therefore, the first connecting mechanism 30 and the second connecting mechanism 50 cooperate to connect the first tray 22 and the second tray 42, combining the server module 20 and the expansion module 40 into a whole with a size specification of 2U. The second circuit board 44 is electrically connected to the first circuit board 26 via a cable, enabling the server module 20 and the expansion module 40 to function as a 2U server. Therefore, in this embodiment, the server module 20 can be used as an independent 1U server or stacked with the expansion module 40 to function as a 2U server.

It should be understood that the server module 20 can include various types of first circuit boards 26, such as motherboards, a host bus adapter card (HBA), a power distribution board (PDB), etc. When combining the server module 20 with the expansion module 40 into a whole with a size specification of 2U, the second circuit board 44 in the expansion module 40 can be connected to one or more different types of first circuit boards 26 according to actual needs. For example, if the second circuit board 44 in the expansion module 40 is a storage module circuit board, it needs to be connected to the motherboard, HBA card, and PDB card in the server module 20.

According to some embodiments, the server module 20 functions as a complete computing node that can be used independently, while the expansion module can be configured for storage, computing, or any other desired configuration. When the server module 20 needs to increase storage or computing capacity, a corresponding expansion module 40 can be stacked beneath the server module 20 and shares the computing node, thereby combining with the server module 20 to form a 2U-sized server, and there is no need to redesign the chassis. Therefore, during production and sales, the server module 20 can be sold separately and used as an independent server, or it can be combined and sold with appropriate expansion modules 40 to meet different user requirements.

In this embodiment, both the server module 20 and the expansion module 40 have a size specification of 1U, resulting in a combined server 100 with a size specification of 2U. It should be understood that in other embodiments, the size of the server module 20 can be not only 1U but also other specifications such as 2U, 3U, or 4U. Similarly, the size of the expansion module can also be 1U, 2U, 3U, or 4U, among others. During usage, the combination can be tailored according to customer's actual requirements. For example, a 1U server module 20 can be combined with a 2U expansion module 40 to create a 3U server, or a 2U server module 20 can be combined with a 1U expansion module 40 to create a 3U server. Additionally, a 2U server module 20 can be combined with a 4U expansion module 40 to create a 6U server, or a 2U server module 20 can be combined with a 3U expansion module 40 to create a 5U server, and so on. These examples are not exhaustive.

As shown in FIG. 2, in this embodiment, the first tray 22 includes a first base plate 220, a first side wall 221, and a second side wall 222 opposite to the first side wall 221, the first side wall 221 and the second side wall 222 are perpendicular to the first base plate 220. The top cover 24 is covered on the first side wall 221 and the second side wall 222. The first base plate 220 is equipped with a through-hole 28 through which cables (not shown) connect the second circuit board 44 to the first circuit board 26. The second tray 42 includes a second base plate 420, a third side wall 421, and a fourth side wall 422 opposite to the third side wall 421, the third side wall 421 and the fourth side wall 422 are perpendicular to the second base plate 420. When the first tray 22 is connected to the second tray 42, the first base plate 220 is covered on the third side wall 421 and the fourth side wall 422 of the second tray 42. The second tray 42 further includes a crossbeam 424 spans across the third side wall 421 and the fourth side wall 422, the crossbeam 424 is supported on the third side wall 421 and fourth side wall 422.

As shown in FIG. 2, FIG. 3, FIG. 4, FIG. 7, and FIG. 8, the first connecting mechanism 30 includes multiple guide slots 32 located on the first side wall 221 and the second side wall 222. The second connecting mechanism 50 includes multiple guide pins 52 located on the third side wall 421 and the fourth side wall 422. The multiple guide slots 32 and the multiple guide pins 52 cooperate to connect the first connecting mechanism 30 to the second connecting mechanism 50, such that the first tray 22 is secured to the second tray 42.

The figures only show the guide slots 32 on the second side wall 222 and the guide pins 52 on the fourth side wall 422. However, it should be understood that the corresponding guide slots 32 and guide pins 52 are also present on the first side wall 221 and the third side wall 421 at corresponding positions. In this embodiment, four guide slots 32 and four guide pins 52 are arranged on the second side wall 222 and the fourth side wall 422, respectively. It should be understood that in other embodiments, the number of guide slots 32 and guide pins 52 can be adjusted based on actual requirements. For example, two, three, or five guide slots 32 and guide pins 52 can be set on each of the second side wall 222 and the fourth side wall 422. Similarly, the first side wall 221 and the third side wall 421 would have the same number of corresponding guide slots 32 and guide pins 52.

According to some embodiments, as shown in FIG. 2, FIG. 3, FIG. 4, FIG. 7 and FIG. 8, the guide slot 32 is L-shaped and includes a vertical section 321 perpendicular to the first base plate 220 and a sliding section 322 parallel to the first base plate 220. The vertical section 321 defines an opening 323 at an end facing the second tray 42. Correspondingly, the guide pins 52 extend from the third side wall 421 and the fourth side wall 422 into an inner space of the second tray 42. When connecting the first tray 22 to the second tray 42, the guide pins 52 enter the guide slots 32 through the openings 323 and slide along the guide slots 32 to secure the first tray 22 to the second tray 42.

Specifically, when connecting the first tray 22 to the second tray 42, align the openings 323 of the guide slots 32 on the first tray 22 with the guide pins 52 on the second tray 42. Then, engage the first tray 22 with the second tray 42, allowing the guide pins 52 to enter the vertical sections 321 of the corresponding guide slots 32. As the first tray 22 contacts the second tray 42, the guide pins 52 reach bend portions of the L-shaped guide slots 32, the bend portion is the connection part between the vertical section 321 and the sliding section 322. Subsequently, the first tray 22 can slide relative to the second tray 42, allowing the guide pins 52 to slide along the sliding sections 322 of the guide slots 32 until the first tray 22 is properly positioned and fixed to the second tray 42.

According to some embodiments, as shown in FIG. 2, FIG. 3, FIG. 4, FIG. 7, and FIG. 8, the third side wall 421 and the fourth side wall 422 include multiple raised portions 54 correspond to the guide pins 52. Each guide pins 52 is set on one of the multiple raised portions 54. The first side wall 221 and the second side wall 222 have multiple recessed portions 34 correspond to the guide slots 32, each guide slot 32 is defined on one of the multiple recessed portions 34. The recessed portion 34 concaves from the first side wall 221 or the second side wall 222 to inner space of the first tray 22.

Therefore, when the first tray 22 is secured to the second tray 42, the first side wall 221 aligns with the third side wall 421, and the second side wall 222 aligns with the fourth side wall 422, ensuring a flat exterior appearance for the 2U server.

It should be noted that, in the illustrated embodiment, multiple guide slots and multiple guide pins are arranged on server 100, in further embodiments, the number of the guide slot and the guide pin may be adjusted according to actual requirement, for example, the first connecting mechanism may include one guide slot defined on the first side wall or the second side, the second connecting mechanism include one guide pin located on the third side wall or the fourth side wall corresponding to the guide slot, the guide pin inserts and slides along the guide slot to connect the first connecting mechanism to the second connecting mechanism, such that the first tray is secured to the second tray.

As shown in FIG. 2, FIG. 3, FIG. 6, FIG. 7, and FIG. 10, the first connecting mechanism 30 includes multiple positioning holes 33 on the first base plate 220, and the second connecting mechanism 50 includes multiple positioning pins 53 on the crossbeam 424. The first base plate 220 and the crossbeam 424 are partially sectioned to show the structure of the positioning holes 33 and positioning pins 53. The positioning hole 33 includes an insertion section 331 and a fixed section 332, where the width W1 of the insertion section 331 is greater than the width W2 of the fixed section 332. The positioning pins 53 are configured to pass through the insertion sections 331 of the positioning holes 33 when the first tray 22 is placed on the second tray 42, and slide into the fixed sections 332 when the first tray 22 is slid relative to the second tray 42 to the proper position.

In some embodiments, the positioning pin 53 includes a connecting portion 531 and a fixing portion 532. The connecting portion 531 is connected to the crossbeam 424, while the fixing portion 532 is located at one end of the connecting portion 531 away from the crossbeam 424 and protrudes radially form the connecting portion 531. The diameter D of the fixing portion 532 is between the width W2 of the fixed section 332 and the width W1 of the insertion section 331 of the positioning hole 33. Therefore, when the positioning pins 53 slide into the fixed sections 332, the connecting portion 531 is fixed within the fixed sections 332, and the fixing portion 532 prevents the positioning pins 53 from loosening out of the positioning holes 33.

In this embodiment, as shown in FIG. 2 and FIG. 3, there are two positioning pins 53 arranged on the crossbeam 424, correspondingly, two positioning holes 33 are defined on the first base plate 220 of the first tray 22. It should be understood that in other embodiments, a different number of positioning pins 53 and positioning holes 33 can be set to guide the sliding and fixation of the first tray 22 relative to the second tray 42, such as one positioning pin 53 on the crossbeam 424 and one positioning hole 33 in the first base plate 220.

According to some embodiments, referring to FIG. 3 FIG. 5, FIG. 7, and FIG. 9, the first tray 22 further includes a first front wall 223 connected between the first side wall 221 and the second side wall 222. The first front wall 223 is positioned on a side of the vertical section 321 of the guide slot 32 away from the sliding section 322. The first front wall 223 defines at least one limiting hole 36. The second tray 42 includes a second front wall 423 connected between the third side wall 421 and the fourth side wall 422. The second front wall 423 is provided with at least one stop 56 corresponding to the at least one limiting hole 36. The stop 56 extends from the second front wall 423 into inner space of the second tray 42. When the first tray 22 is connected to the second tray 42, the stop 56 extends into the limiting hole 36, fixing the first tray 22 relative to the second tray 42.

Therefore, when the first tray 22 slides relative to the second tray 42 to a proper position, the stop 56 inserts into the limiting hole 36, working together with the guide pins 52 and guide slots 32 to secure the first tray 22 relative to the second tray 42.

According to some embodiments, as shown in FIG. 3, FIG. 5, FIG. 7, and FIG. 9, the second front wall 423 includes at least one ear 58, and the at least one stop 56 is formed on the at least one ear 58. The first front wall 223 defines at least one recess 38 corresponding to the at least one ear, the recess 38 has a shape matching the protrusion 58, and the limiting hole 36 is defined within the recess 38. The recess 38 concaves from the first front wall 223 to the inner space of the first tray 22.

Therefore, when the first tray 22 is connected to the second tray 42, the first front wall 223 and the second front wall 423 can remain flush, resulting in a flat exterior appearance of the assembled 2U server.

According to some embodiments, as shown in FIG. 1 and FIG. 2, the server 100 further includes connectors 60, the connectors 60 is used to connect the first tray 22 and the second tray 42 together. In the illustrated embodiment, the server 100 includes two connectors 60, one of the two connectors 60 connects the first side wall 221 and the third side wall 421, and the other of the two connectors 60 connects the second side wall 222 and the fourth side wall 422.

Therefore, after the first tray 22 is properly secured to the second tray 42 by cooperation of the guide pins 52 and the guide slots 32 and cooperation of the stops 56 and the limiting holes 36, the first tray 22 and the second tray 42 are further secured together by the two connectors 60.

According to some embodiments, the connectors 60 are connected to the first tray 22 and the second tray 42 by bolts. Therefore, after the first tray 22 and the second tray 42 are connected to form a 2U server, they can be disassembled if needed to replace the expansion modules 40 with different configurations, or the server module 20 can be used as a standalone 1U server.

According to some embodiments, the server 100 may include more than one expansion modules 40, and the second circuit boards 44 of the more than one expansion modules 40 are electrically connected to the first circuit board 26 via cables to share the computing node, and thus forming a server in combination with the server module 20.

According to some embodiments, the more than one expansion modules 40 can be stacked one by one beneath the server module 20, or the server module 20 can be sandwiched between the more than one expansion modules 40.

According to some embodiments, each of the server module 20 and the expansion modules 40 are equipped with the first connecting mechanism 30 and the second connecting mechanism 50. Then the server module 20 can be connected to one or more expansion modules 40 in any desired arrangement.

Correspondingly, in these embodiments, the server 100 includes multiple connectors 60 to connect the first tray 22 of the server module 20 or the second tray 42 of the expansion modules 40 to the second tray 42 of other expansion modules 40. Specifically, the connectors 60 are used to connect the first tray 22 or the second tray 42 to the adjacent second tray 42.

Figure 11:
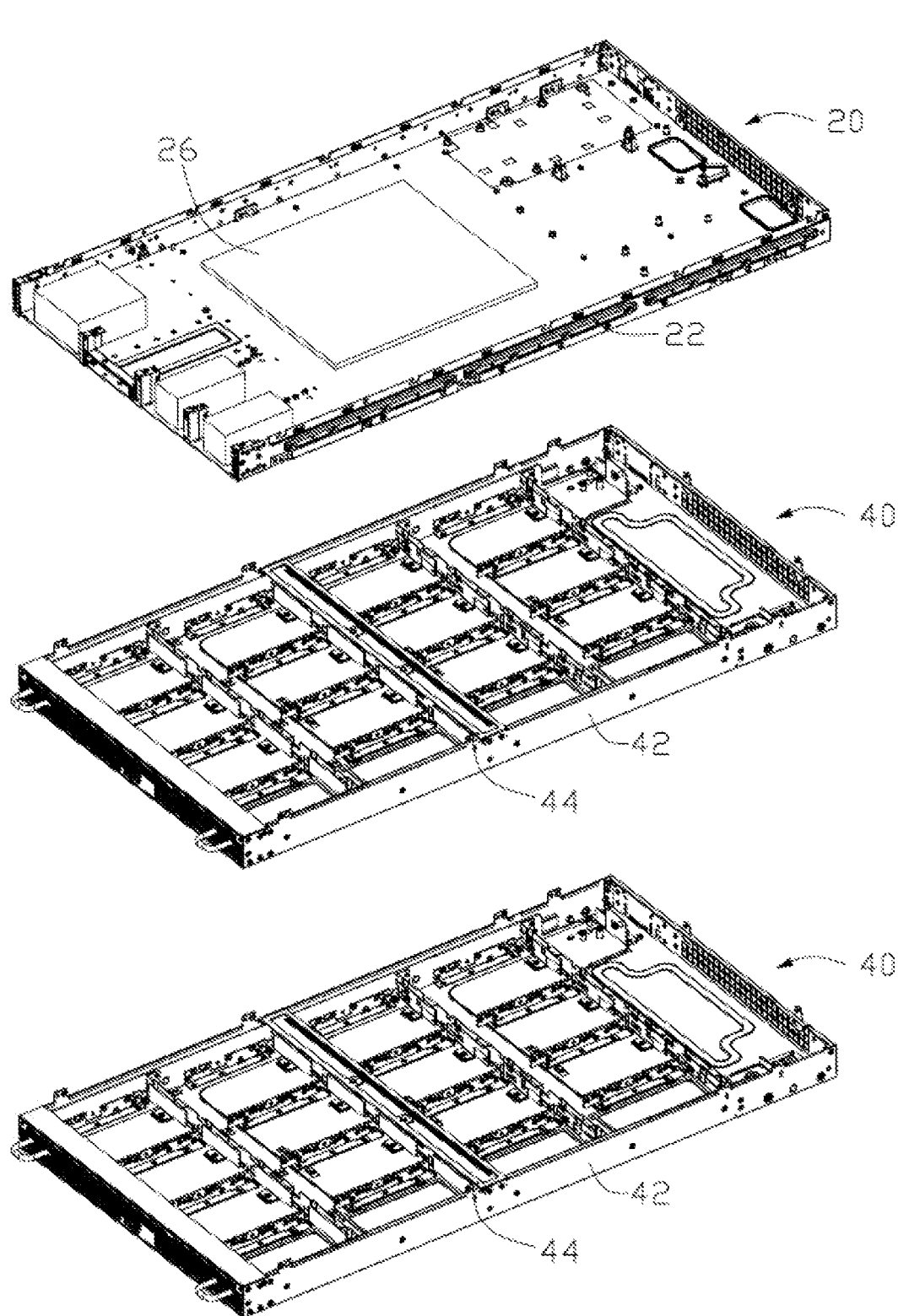
FIG. 11 is a perspective view of a server system according to an embodiment of the present application.
Figure 12:
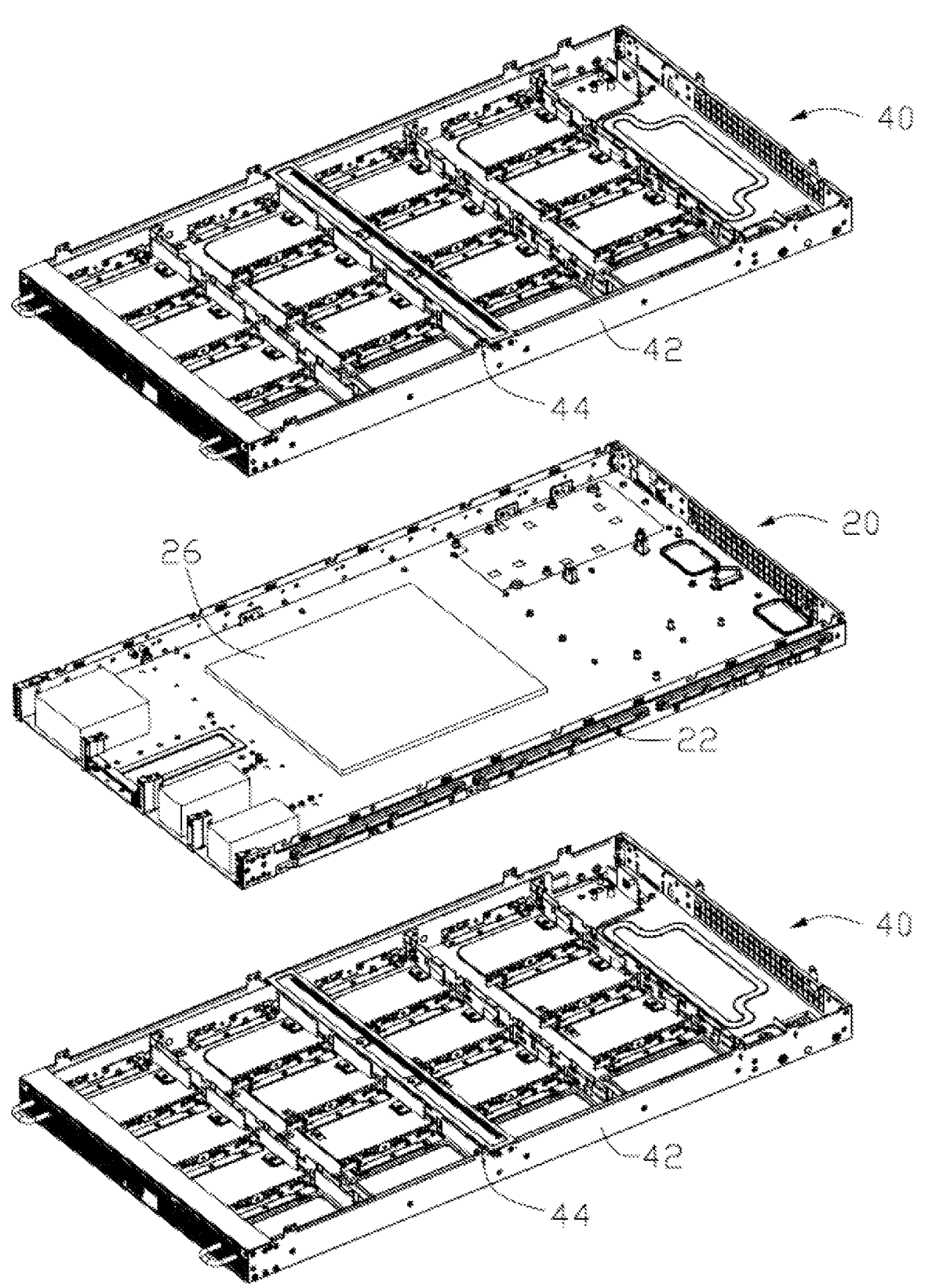
FIG. 12 is a perspective view of another server system according to an embodiment of the present application.

Referring to FIG. 11 and FIG. 12, a server system 200 is provided, the server system 200 includes a server module 20 and multiple expansion modules 40. The server module 20 includes a first tray 22 and a first circuit board 26 mounted on the first tray 22. The expansion module 40 includes a second tray 42 and a second circuit board 44 mounted on the second tray 42. In a first configuration, the server module 20 operates independently of the multiple expansion modules 40, and the server module 20 acts as a server. In a second configuration, the second circuit board 44 of each of the multiple expansion modules 40 is connected to the first circuit board 26, the server module 20 cooperates with the multiple expansion modules 40 to perform as a server.

According to some embodiments, the server module 20 is designed with a specification of 1U, 2U, or 3U, and each of the multiple expansion modules 40 is designed with a specification of 1U, 2U, or 3U. The expansion modules 40 may be designed with the same specification or different specifications, which is not limited here.

According to some embodiments, in the second configuration, the multiple expansion modules 40 are stacked one by one beneath the server module 20.

According to some embodiments, in the second configuration, the server module 20 is sandwiched between the multiple expansion modules 40.

While the present application has been described in detail in connection with only a limited number of embodiments, it should be readily understood for the skilled in the art that the present application is not limited to such disclosed embodiments. Rather, the present application can be modified to incorporate any number of variations, alterations, substitutions, or equivalent arrangements not heretofore described, but which are commensurate with the spirit and scope of the present application. Additionally, while various embodiments of the present application have been described, it is to be understood that aspects of the present application may include only some of the described embodiments. Accordingly, the present application is not to be seen as limited by the foregoing description but is only limited by the scope of the appended claims.

What is claimed is:

1. A server comprising:
a server module comprising:
    a first tray, the first tray is provided with a first connecting mechanism;
    a first circuit board mounted on the first tray; and
    a top cover covered on the first tray, enclosing the first circuit board between the first tray and the top cover; and
an expansion module comprising:
    a second tray, the second tray is provided with a second connecting mechanism, the second connecting mechanism matches with the first connecting mechanism, and
    a second circuit board mounted on the second tray, the second circuit board is electrically connected to the first circuit board;
wherein the first tray comprises a first base plate, a first side wall, and a second side wall opposite to the first side wall, the first side wall and the second side wall are arranged on and perpendicular to the first base plate, the first base plate is equipped with a through hole providing access for electrically connecting the second circuit board to the first circuit board, the top cover is covered on the first side wall and the second side wall, the second tray comprises a second base plate, a third side wall, and a fourth side wall opposite to the third side wall, the third side wall and the fourth side wall are arranged on and perpendicular to the second base plate, the first base plate is covered on the third side wall and the fourth side wall of the second tray, the second tray further comprises a crossbeam spanning across the third side wall and fourth side wall, the crossbeam is supported on the third side wall and fourth side wall, and the first connecting mechanism further comprises a positioning hole defined on the first base plate, the second connecting mechanism further comprises a positioning pin arranged on the crossbeam, the positioning pin is configured for inserting into the positioning hole for positioning the first tray relative to the second tray, the first connecting mechanism comprises a guide slot defined on the first side wall or the second side wall, the second connecting mechanism comprises a guide pin located on the third side wall or on the fourth side wall corresponding to the guide slot, and the guide pin inserts and slides along the guide slot to connect the first connecting mechanism to the second connecting mechanism, such that the first tray is secured to the second tray; the guide slot comprises a vertical section perpendicular to the first base plate and a sliding section parallel to the first base plate, the vertical section defines an opening at an end facing the second tray, and the guide pin extends from the third side wall and/or extends form the fourth side wall into an inner space of the second tray, and the guide pin is configured for entering the guide slot from the opening;

a raised portion is provided on the third side wall or on the fourth side wall, the guide pin is set on the raised portion, a recessed portion is arranged on the first side wall or the second side wall, the recessed portion concaves from the first side wall or concaves from the second side wall to an inner space of the first tray, the guide slot is defined on the recessed portion.

2. The server of claim 1, wherein the server module is designed with a specification of 1U, 2U, or 3U, the expansion module is designed with a specification of 1U, 2U, or 3U.

3. The server of claim 1, wherein the first connecting mechanism comprises more than one guide slots defined on the first side wall and the second side wall, the first side wall and the second side wall are provided with more than one recessed portions, the more than one guide slots are respectively defined on the more than one recessed portions,
    the second connecting mechanism comprises more than one guide pins located on the third side wall and the fourth side wall corresponding to the more than one guide slots, and
    the third side wall and the fourth side wall are provided with more than one raised portions, the more than one guide pins are respectively arranged on the more than one raised portions.

4. The server of claim 1, wherein the positioning hole comprises an insertion section and a fixed section, a width of the insertion section is greater than a width of the fixed section, and
    the positioning pin comprises a connecting portion and a fixing portion, the connecting portion is connected to the crossbeam, the fixing portion is located at one end of the connecting portion away from the crossbeam and protrudes radially from the connecting portion, the fixing portion has a diameter between the width of the fixed section and the width of the insertion section, such that the positioning pin is prevented from loosening out of the positioning hole.

5. The server of claim 4, wherein the first tray further comprises a first front wall connected between the first side wall and the second side wall, the first front wall is positioned on a side of the vertical section of the guide slot away from the sliding section, the first front wall defines a limiting hole,
    the second tray comprises a second front wall connected between the third side wall and the fourth side wall, the second front wall is provided with a stop corresponding to the limiting hole, the stop extends from the second front wall into an inner space of the second tray, and
    the stop is configured for positioning the first tray relative to the second tray by inserting into the limiting hole.

6. The server of claim 5, wherein the first front wall defines more than one limiting holes, the second front wall is provided with more than one stops, the more than one stops respectively insert into the more than one limiting holes to position the first tray relative to the second tray.

7. The server of claim 5, wherein the server further comprises a plurality of connectors for connecting the first tray to the second tray.

8. The server of claim 1, wherein the first connecting mechanism further comprises more than one positioning holes defined on the first base plate, the second connecting mechanism further comprises more than one positioning pins arranged on the crossbeam, the more than one positioning pins insert into the more than one positioning holes respectively to secure the first tray relative to the second tray.

9. The server of claim 1, wherein the server further comprises more than one expansion modules, the second circuit board of each of the more than one expansion modules is electrically connected to the first circuit board, the server module is equipped with the first connecting mechanism; and each of the more than one expansion modules is equipped with the second connecting mechanism.

* * * * *